United States Patent [19]
Gupta

[11] Patent Number: 5,451,274
[45] Date of Patent: Sep. 19, 1995

[54] REFLOW OF MULTI-LAYER METAL BUMPS

[75] Inventor: Debabrata Gupta, Scottsdale, Ariz.

[73] Assignee: Motorola, Inc., Schaumburg, Ill.

[21] Appl. No.: 188,989

[22] Filed: Jan. 31, 1994

[51] Int. Cl.$^6$ ............................. C22C 1/02; C22C 5/02
[52] U.S. Cl. ...................... 148/512; 148/525; 437/183
[58] Field of Search ........................ 148/511, 512, 525; 437/183

[56] References Cited

U.S. PATENT DOCUMENTS 5,250,469 10/1993 Tanaka et al. ...................... 437/183

*Primary Examiner*—George Wyszomierski

[57] ABSTRACT

A method and apparatus for re-flow of multi-layer metal bumps. A multi layer metal bump structure is surrounded by an oxygen poor environment. The topmost layer of the metal bump structure is heated by using infrared light for a predetermined time. The infrared light has a wavelength which is selected such that the top layer is heated more than the underlying layers.

8 Claims, 1 Drawing Sheet

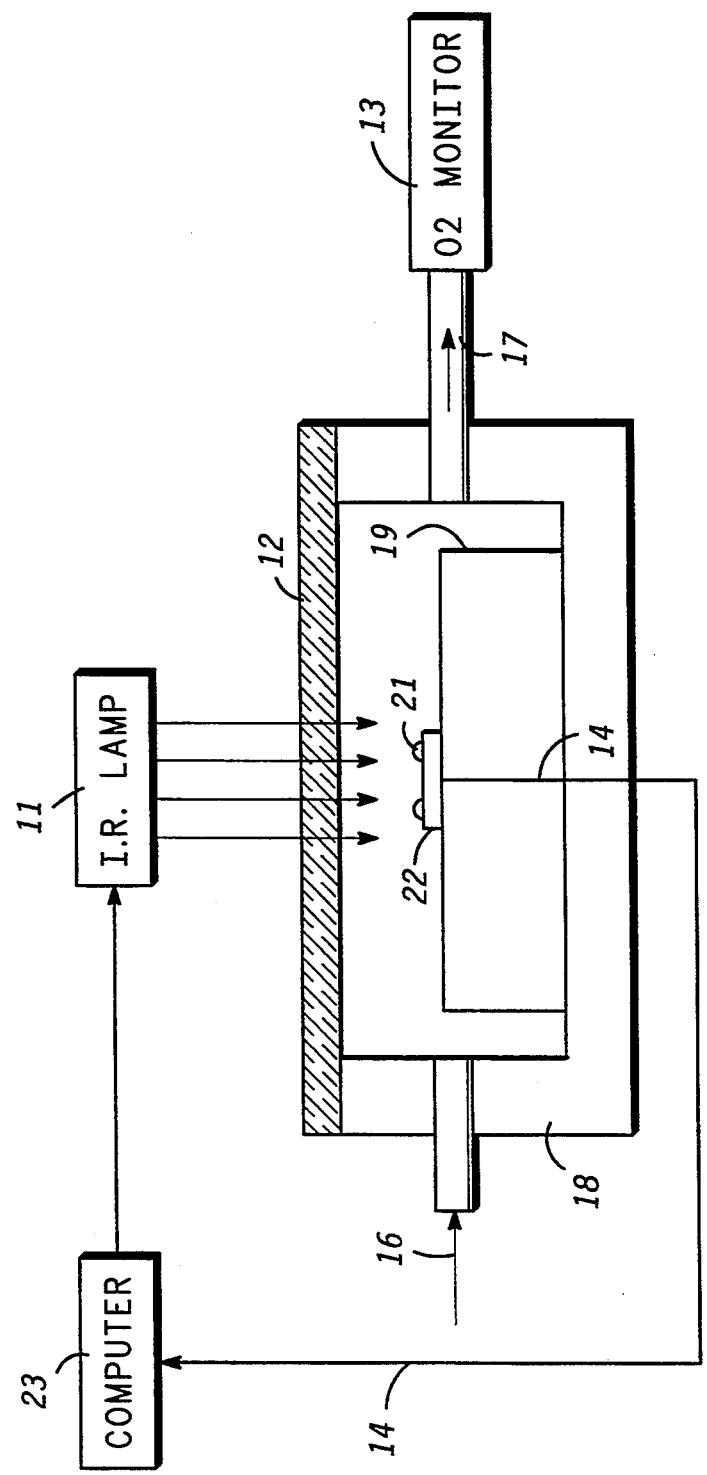

REFLOW OF MULTI-LAYER METAL BUMPS

BACKGROUND OF THE INVENTION

The present invention relates, in general, to an apparatus and method for alloying metals, and more particularly to an apparatus and method for re-flow of multi-layer metal bumps.

Both tape automated bonding (TAB) and flip chip bonding (FCB) of electronic components such as IC chips and passive components often use gold bumps deposited on a device to interconnect them to the next level of assembly, that is the substrate or board. Metallurgical bonds are created during bonding by applying a suitable load and temperature between the gold bumps and corresponding leads (in the case of TAB) or bond pads (in the case of FCB) for times of up to 120 seconds. The total bonding energy as well as the temperature required for this type of assembly has become unacceptably large as the lead count on chips has continued to increase. In addition, semiconductor materials such as gallium arsenide are more fragile than silicon further aggravating the problem.

By replacing the gold-gold bond mentioned above by a gold-tin-gold system the bond loads and times are reduced. This scheme is typically followed by industrial users of the TAB interconnection scheme. By creating a gold-tin eutectic cap on top of the gold bumps prior to TAB bonding, Prof. Reichl's group at the Technical University of Berlin had by 1990 been able to lower the bonding load 3 fold over the unreflowed tin cap method. This was described in the paper "The application of an eutectic gold-tin cushion for TAB inner lead bonding with reduced bonding pressure", Zakel E., Schuler S. and Simon J., Microsystems, Berlin, 1990 and the paper "Au-Sn bonding metallurgy of TAB contacts and its influence on the Kirkendall Effect in the ternary Cu-Au-Sn system", Zakel E. and Reichl H., Proc. 1992 E.C.T.C., 1992, pp. 360-71.

The technique used for reflowing the tin capped wafers described by the Technical University of Berlin group in their papers consisted of heating the wafers with tin capped bumps in a tube furnace at 340° C. with flowing nitrogen for 8 to 10 minutes. The bumps after such processing were found to have several types of defects that adversely affected bonding.

There were two main defects reported after reflow in the tube furnace. The first defect was runoff; that is the tin cap over some of the gold bumps melted and ran down the side of the bumps rather than alloying with the gold to form the desired eutectic. This left behind an inadequate amount of eutectic for bonding. The second defect was termed "mulberries"; rather than forming the desired low melting domed eutectic cap, some bumps after reflow had a granular layer. This second defect was more serious as it made bonding impossible. Often wafers would have mostly "mulberry" type bumps.

For ideal low-load bonding (be it TAB or Flip Chip), it is necessary to create a liquid phase between the bumps and the leads/bond pads. This is possible at a relatively low bonding temperature (280°-310° C.) when a eutectic cap is reflowed over the gold bumps. Zeta phase is an alloy of gold and tin which can form at temperatures as low as 190° C. (lower than the eutectic temperature of 280° C.) yet does not melt below 500° C. The Zeta phase has gold content (>90% by weight) greater than that of the eutectic (80% by weight) and therefore its formation is also favored due to the higher diffusivity of gold into tin compared to tin into gold. If a Zeta phase cap forms over the bump, it cannot be melted below 500° C. a temperature to which neither finished GaAs nor Si devices should be subjected to. Even if this was allowable the resulting bond will not be reliable due to the brittleness of Zeta phase.

There is a need for a method and apparatus for reflow of multi-layer metal bumps which controls run off while simultaneously minimizing both the production of "mulberries" and the production of Zeta phase. The method should be easily controlled and applicable to a wide range of metal bumps.

BRIEF DESCRIPTION OF THE DRAWINGS

The single FIGURE shows a simplified cross section of a reflow system.

DETAILED DESCRIPTION OF THE DRAWINGS

The single FIGURE shows a simplified cross section of a reflow system. An infra-red lamp 11 is focused through a window 12 onto a plurality of metal bumps 21. Infra-red lamp 11 is typically a 200 watt quartz infra-red lamp with a peak wavelength in the 0.8-1.2 micrometer range. A suitable lamp is manufactured commercially by Ushio Corporation, Osram and Research Inc. Metal bumps 21 are formed from at least two layers of dissimilar metal. Typically metal bumps 21 are formed using materials such as tin over gold, indium over gold, tin over lead, and bismuth over tin. Those of skill in the art may readily see that other metals may also be used to form metal bumps 21. Metal bumps 21 are deposited on a substrate 22. A thermocouple 14 monitors the temperature of substrate 22. Thermocouple 14 is monitored by a computer 23 which controls infra-red lamp 11. Substrate 22 in turn is supported on a pedestal 19. An environmental chamber 18 surrounds metal bumps 21, substrate 22, and pedestal 19. Environmental chamber 18 is sealed by window 12 to form a sealed chamber. An inlet 16 introduces a flow of inert gas such as nitrogen into environmental chamber 18. An outlet 17 allows gas to escape from environmental chamber 18. Outlet 17 is coupled to an oxygen monitor 13 which measures the oxygen level of the gas within environmental chamber 18.

To begin the reflow operation, substrate 22 on which multilayer metallic bumps 21 have already been formed is inserted into environmental chamber 18. Quartz window 12 is then attached to chamber 18 to form a sealed joint. An inert gas such as argon, nitrogen or a nitrogen/hydrogen mixture is then injected through inlet 16 to flush the air from chamber 18 and create a low oxygen environment conducive to predictable reflow behavior. Outlet 17 of chamber 18 is connected to an oxygen monitor 13 which indicates the instantaneous oxygen level in chamber 18. The tin cap thickness and grain size are attributes of bumps 21 which determine the amount of eutectic produced. In order to ensure that sufficient eutectic is produced, these attributes are entered into computer 23. Computer 23 uses these parameters to control the duration of the infra-red beam so that the desired amount of eutectic alloy is formed. Infra-red lamp 11 is positioned over window 12 and its beam is focused on the top surface of substrate 22 using full power. Simultaneously the temperature output of thermocouple 14 is checked with a voltmeter as well as read in computer 23. The focusing also checks the basic control functions of computer 23.

Once the desired oxygen level (20–2000 ppm) has been reached in chamber 18, reflow is commenced by running a program resident in computer 23. The program predicts the ideal dosage (time at a desired temperature) for the type of bump 21, ramps infra-red lamp 11 through rising power levels and monitors thermocouple 14 to compute actual dosage. Once the desired dosage is imparted infra-red lamp 11 is automatically shut-off. After control thermocouple 14 indicates temperature lower than 150° C., oxygen monitor 13 is switched off, the purge gas is turned off and then quartz window 12 is removed to break the seal. At this time substrate 22 (dice or wafer) can be taken out of chamber 18. Typically metal bumps 21 are then used to form interconnections on a flip chip assembly or a TAB mounted die by bonding metal bumps 22 to a package assembly.

The Zeta phase has a granular morphology and has been found to be the so-called "mulberries". This phenomenon is affected by the morphology of the tin cap. The more discontinuous that cap (as in plated rather than evaporated tin), the easier is the formation of the Zeta phase. Zeta phase cannot be completely avoided however its extent is drastically reduced by the preferential infra-red heating, while leaving behind an eutectic dome sufficiently thick for excellent bonding.

From the above studies it became evident that for ideal reflow of tin capped gold bumps it was necessary to prevent the diffusion of gold into the plated tin cap. It was also necessary to heat the wafers in a uniform manner between 220° C. (melting temperature of tin) and 280° C. (temperature for formation of gold-tin eutectic).

The higher rate of diffusion of gold into tin relative to tin into gold was reduced by reducing the temperature of the gold bumps.

This apparatus and method is equally applicable for reflow of other bump structures where similar metallurgical problems may exist.

A computer program was developed to predict the thickness of the eutectic layer formed during the infra-red reflow operation. The program predicts thickness as a function of infra-red lamp 11 power setting and on-time. As a result the desired amount of eutectic could be formed and having once formed its conversion to Zeta phase due to prolonged exposure to the beam can be prevented. This program also allowed compensation for variations in heating rate of the bumped substrate either due to presence of tarnishes etc. left over from chemical processing of the substrates (wafer, dice), or degradation of the lamp.

This computer program used experimental data from reflow experiments in two ways to improve the predictability of reflowed bump structure. First a mathematical model for reflow, based on kinetic data obtained using the apparatus of this invention, was developed. Families of curves showing the measured thicknesses of the eutectic and Zeta phases were plotted as a function of reflow time for various levels of lamp power. The kinetic data was fitted to standard equations for diffusion controlled reactions and the parameter values extracted. These values were used in computer 23 program that controlled infra-red lamp 11 in the reflow apparatus of this invention to set the ideal reflow lamp power. However wafer to wafer variations or even run to run variations in lamp output, degraded the predictability of the structure of reflowed bumps calculated from this model. These variations caused the actual results of measured phase thicknesses to deviate up to 15% from model predictions.

In the second part of the control program additional procedures to compensate for these variations were introduced. Easy to measure instantaneous quantities such as the temperature at the backside of the substrate ($t_{sb}$) containing the bumps undergoing reflow is attractive as a response variable to generate control signals to infra-red lamp 11 and cause it to raise or lower beam strengths so as to maintain the backside temperature to a prescribed profile. The temperature $t_{sb}$, however is not the best quantity to directly use as an input to the controller since its response to changes in controller output such as lamp power setting is unacceptably slow. This is due to the thermal mass of the substrate as well as slowness of infra-red lamp 11 itself to respond to control signals. Therefore an alternative control strategy is used.

A dosage function $C_{Au}$ that described the cumulative gold diffused into the molten tin cap at the tip of the bumps at a given time was evaluated as a calculated response variable. High correlation was found between $C_{Au}$ and the measured phase thicknesses, thus indicating its suitability as a predictor. Calculating this function however required the instantaneous temperature of the tin cap, gold inter-diffusion coefficient at that temperature, and the time for which the cap was in a molten state-variables that were all difficult to measure. Therefore it was necessary to find an alternative relation. A 97% correlation was found between the actual dosage calculated from compositional measurements on cross sections of reflowed bumps and the easy to measure temperature $t_{sb}$. Therefore $t_{sb}$ was used to calculate the cumulative response variable $C_{Au}$ and control the lamp.

During the reflow operation measured temperature $t_{sb}$ is used by computer 23 to calculate and update the $C_{Au}$ repeatedly. When the desired dosage is reached the lamp is shut off. Using this control strategy the deviations between actual and expected eutectic thickness in the reflowed bumps, in spite of aforementioned variations, was kept within 6%, an improvement which helps obtain reliable flip chip bonds later.

Through theoretical analysis and experimentation it was determined that in order to prevent excessive formation of the Zeta phase during reflow, the wavelength of the infra-red beam should be such that the tin caps on the gold bumps are heated preferentially to compensate for the faster diffusion of gold into tin at a given temperature.

Experimental results obtained using the 200 watt IR lamp are summarized in the table below:

| Time | 60% power | | 80% power | |
| --- | --- | --- | --- | --- |
| | $T_e$ | $T_z$ | $T_e$ | $T_z$ |
| 9 | | | 11.0 | 2.0 |
| 10 | | | 8.0 | 3.0 |
| 12 | | | 5.5 | 5.5 |
| 14 | 10.0 | 2.8 | | |
| 15 | 8.0 | 4.0 | | |
| 20 | 2.5 | 4.0 | 0.0 | 12.0 |
| 24 | 3.0 | 5.0 | | |

Where:
Time=Time maximum power is applied in seconds,
$T_e$=Eutectic thickness in micrometers,
$T_z$=Zeta phase thickness in micrometers.

The wavelength of the infra red light is selected based on well known physical properties of the metals. Commercially available optical filters known to those skilled in the art were used to try out beams with various wave-lengths including the one finally selected to optimize the phase composition in the reflowed bumps. The ideal wavelength for the infra-red reflow of tin caps on gold bumps deposited on gallium arsenide or silicon was thus found to be between 0.8 and 1.0 micron.

Below a wavelength of approximately 0.7 micron, the reflectance of gold is low (its absorption is high) and the gold interconnect lines on the substrate get heated directly by the beam and in turn heat the gold bumps connected to them. Consequently the gold bumps get heated as much as the tin caps themselves and excessive Zeta forms as in the tube furnace method of reflow. Above a wavelength of 1.0 micron infra-red transmission through Gallium Arsenide increases to the extent that the substrate cannot be heated at all and starts acting like a heat-sink. The result is that the tin cap does not melt fast enough and Zeta phase can again form by solid state diffusion at intermediate temperatures.

Similar reasoning and methodology can be used to establish the optimum wave-lengths for the infra-red reflow of Indium capped gold bumps or Tin/Bismuth bumps or bumps fabricated from other metals. While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

By now it should be clear that the present invention provides a method and apparatus for reflow of multi-layer metal bumps which controls run off while simultaneously minimizing the production of "mulberries". The method is easily controlled and applicable to a wide range of metal bumps.

I claim:

1. A method for re-flow of multi-layer metal bumps, comprising:
   providing a metal bump structure having a plurality of layers including a tin top layer over a gold layer;
   placing the metal bump structure in an environmental chamber having an oxygen poor environment; and
   heating the tin top layer with infrared light from an infrared light source to reflow the multi-layer metal bumps, the infrared light having a wavelength which preferentially heats the tin top layer.

2. The method for re-flow of multi-layer metal bumps of claim 1 further comprising:
   continuing the heating until a desired microstructure is formed in the metal bump structure, wherein the desired microstructure includes a eutectic dome having a composition and topography sufficient to bond to a package assembly.

3. The method for re-flow of multi-layer metal bumps of claim 1, further comprising:
   reducing oxygen level within the environmental chamber to lower than 2000 parts per million of oxygen before the step of heating the tin top layer.

4. A method for reflowing multi-layer metal structures comprising the steps of:
   placing a substrate into a chamber, wherein the substrate includes a multi-layer metal bump comprising a gold metal layer and a tin metal layer on top of the gold metal layer;
   reducing oxygen concentration in the chamber to below approximately 2000 parts per million of oxygen; and
   exposing the multi-layer metal bump to an infrared heat source having a wavelength that preferentially heats the tin metal layer compared to the gold metal layer, and wherein the substrate is heated for a time that prevents substantial diffusion of the gold metal layer into the tin metal layer and provides a eutectic dome having a thickness sufficient for bonding to an application substrate.

5. The method of claim 4 wherein the step of exposing the multi-layer metal bump to the infrared heat source includes exposing the multi-layer metal bump to an infrared beam having a wavelength between approximately 0.8 and 1.0 micron.

6. The method of claim 4 wherein the step of exposing the multi-layer bump to the infrared heat source includes exposing the multi-layer bump to a 200 watt infrared heat source for a time less than approximately 15 seconds at 80% lamp power.

7. The method of claim 4 wherein the step of exposing the multi-layer bump to the infrared heat source includes exposing the multi-layer bump to a 200 watt infrared heat source for a time less than approximately 20 seconds at 60% lamp power.

8. The method of claim 4 wherein the step of placing the substrate into the chamber includes placing the substrate into an environmental chamber having a window, and wherein the step of exposing the multi-layer metal bump to the infrared heat source includes exposing the multi-layer bump to an infrared heat source external to the environmental chamber, and wherein the infrared heat source is positioned over the window.

* * * * *